United States Patent [19]

Lowe et al.

[11] Patent Number: 4,621,413
[45] Date of Patent: Nov. 11, 1986

[54] FABRICATING A SEMICONDUCTOR DEVICE WITH REDUCED GATE LEAKAGE

[75] Inventors: Arthur T. Lowe, Chandler; Syd R. Wilson, Phoenix; Schyi-yi Wu, Mesa, all of Ariz.

[73] Assignee: Motorola, Inc., Schaumburg, Ill.

[21] Appl. No.: 740,138

[22] Filed: Jun. 3, 1985

[51] Int. Cl.$^4$ .................. H01L 21/477; H01L 21/425
[52] U.S. Cl. .................... 29/571; 29/576 B; 29/591; 148/1.5; 148/187
[58] Field of Search ............... 29/571, 576 B, 591; 148/1.5, 187

[56] References Cited

U.S. PATENT DOCUMENTS

| | | | |
|---|---|---|---|
| 3,967,981 | 7/1976 | Yamazaki | 148/1.5 |
| 4,229,232 | 10/1980 | Kirkpatrick | 148/1.5 |
| 4,431,459 | 2/1984 | Teng | 148/1.5 |
| 4,482,393 | 11/1984 | Nishiyama et al. | 148/1.5 |
| 4,536,223 | 8/1985 | Faith | 148/1.5 |
| 4,544,418 | 10/1985 | Gibbons | 148/1.5 |
| 4,566,913 | 1/1986 | Brodsky et al. | 148/1.5 |
| 4,575,920 | 3/1986 | Tsunashima | 148/1.5 X |

Primary Examiner—George T. Ozaki
Attorney, Agent, or Firm—Joe E. Barbee

[57] ABSTRACT

Gate current leakage is reduced in a submicron FET device by the deposition of an oxide layer over the gate prior to the rapid heating of the device. This is done to prevent the dopant that was implanted into the gate from collecting on the sidewalls of the gate and the oxide layer between gate and substrate. Otherwise the diffused dopant becomes the path of least resistance, thus creating current leakage from the gate to source or gate to drain.

11 Claims, 4 Drawing Figures

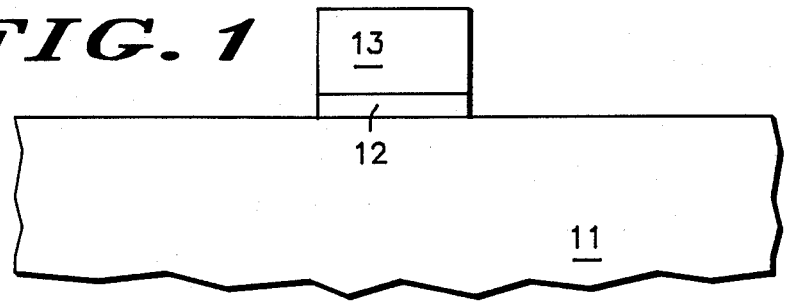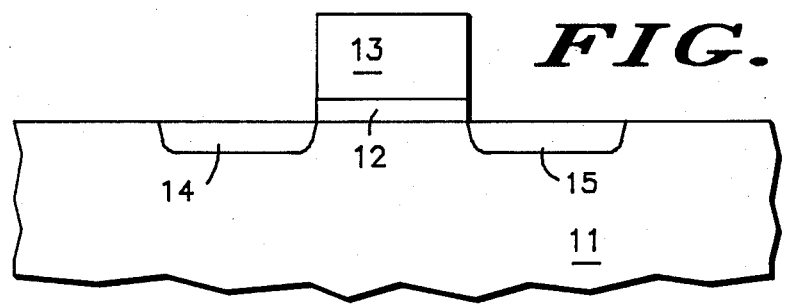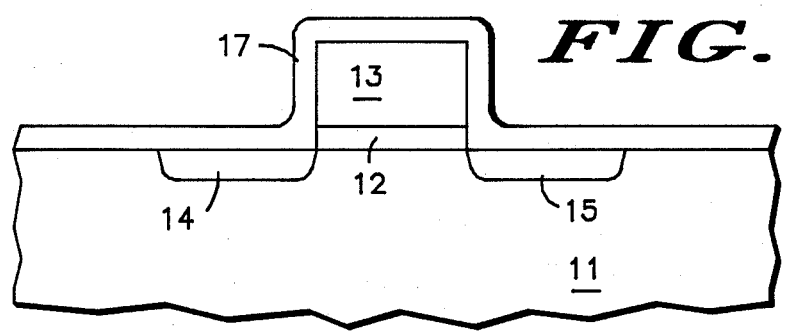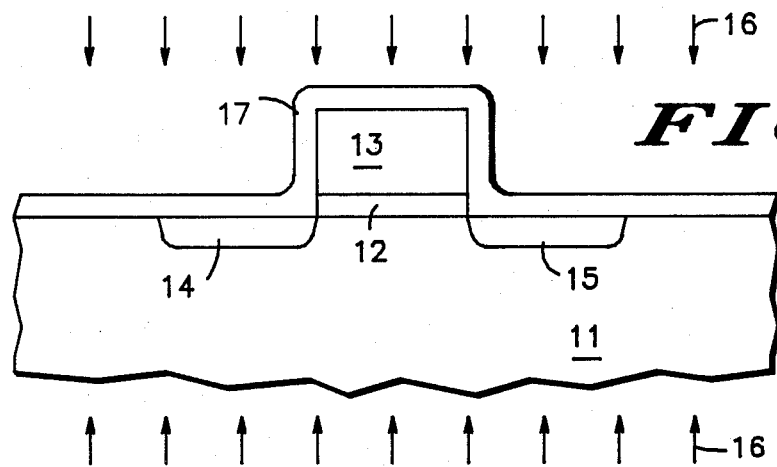

FABRICATING A SEMICONDUCTOR DEVICE WITH REDUCED GATE LEAKAGE

BACKGROUND OF THE INVENTION

This invention relates, in general, to semiconductor devices, and more particularly to a method of fabricating a semiconductor device in which the gate leakage current has been substantially reduced.

The ion implantation of dopants into a semiconductor device will damage or destroy the crystal orientation of the substrate by pushing the atoms out of their normal lattice location. To repair the crystal damage and to activate the dopants that are implanted requires a thermal annealing step after the implant step. The thermal annealing recrystallizes the lattice, and part or all of the implanted ions are activated by substitutionally becoming part of the crystal lattice.

Shrinking device dimensions to sub-micron size includes shallower junctions and narrower gate regions which are found to be sensitive to thermal annealing. Better control of impurity diffusions, for a shallower junction, can be obtained through the use of raPid heating devices such as a Varian IA-200 or a Heatpulse 2101. These devices allow a substrate to be heated to 1200° C. in about 10 to 15 seconds.

Polycrystalline silicon, commonly referred to as polysilicon is used both as a gate material on field effect transistor (F.E.T.) devices and as an interconnect material in many integrated circuits. In self-aligned implant process technology, the source, gate, and drain are all implanted in a single step and heat treated (annealed) in a subsequent step.

However, the combination of polysilicon gate, ion implant and thermal anneal created a problem in which current leaks down the edge of the polysilicon gate to either the source or the drain. This gate leakage problem can probably never be reduced to zero but it can be reduced substantially to an acceptable level.

SUMMARY OF THE INVENTION

Accordingly, it is an object of the present invention to provide a method for improving the yield in the manufacturing of semiconductor FET devices.

Another object of this invention is to decrease or eliminate rejected devices due to unacceptable gate leakage.

It is an additional object of the present invention to reduce gate leakage by depositing a layer of oxide over the gate region prior to the anneal step.

Yet a further object of the present invention is to reduce gate leakage by providing an insulating cap over the gate of a FET during annealing of dopants.

The foregoing and other objects and advantages are achieved in the present invention by one embodiment in which, as part thereof, makes use of the forming of a polysilicon gate region, a source region and a drain region, implanting dopants into the gate, source and drain regions, depositing a layer of oxide over the gate, source and drain regions, and rapid heating of the gate, source and drain regions.

A more complete understanding of the present invention can be attained by considering the following detailed description in conjunction with the accompanying drawings.

BRIEF DESCRIPTION OF THE DRAWINGS

FIG. 1 illustrates a sectional view of a portion of a semiconductor device in which a gate has been formed on a substrate;

FIG. 2 illustrates the sectional view of FIG. 1 with the addition of the source and drain regions;

FIG. 3 illustrates the sectional view of FIG. 2 with the addition of a blanket film of oxide; and FIG. 4 illustrates the sectional view of FIG. 3 with the addition of the rapid heating of the device.

DETAILED DESCRIPTION OF THE INVENTION

FIGS. 1-4 illustrate a method for manufacturing an improved semiconductor device in which gate to drain or gate to source current leakage is reduced to an acceptable level. In the illustration shown, a device with a gate leakage of more than 500 picoamps ($500 \times 10^{-12}$) would be considered unacceptable. Devices that were manufactured without the layer of oxide had a gate leakage in the milliamp ($10^{-3}$) range. Accordingly, the layer of oxide contributed to substantially reducing the gate leakage.

FIGS. 1-4 represent a portion of an integrated circuit which is formed in accordance with the teachings of the present invention. For purposes of simplicity, the drawings show a portion of a substrate 11 which contains additional active and passive components that are not shown.

FIG. 1 illustrates a sectional view of a portion of a semiconductor device in which polysilicon gate 13 has been formed above substrate 11. Gate 13 is prevented from making contact with substrate 11 by oxide layer 12. In a preferred embodiment, oxide layer 12 is silicon dioxide and is approximately 150 Angstroms thick with a range of 80 to 500 Angstroms thick. Polysilicon gate 13 is approximately 4000 Angstroms thick with a range of 500 to 5000 Angstroms thick, and is formed using conventional masking and etching techniques known in the art.

FIG. 2 illustrates the sectional view of FIG. 1 with the addition of source 14 and drain 15. Implanting arsenic for an N-type and boron or boron difluoride for a P-type device and using photoresist as a mask, source 14 and drain 15 are formed. Arsenic is also implanted into polysilicon gate 13. Gate 13 also serves as a mask to provide proper spacing between source and drain, this is sometimes called self aligning.

FIG. 3 illustrates the sectional view of FIG. 2 with the addition of a blanket layer of oxide 17. Oxide layer 17 is approximately 1000 Angstroms thick in this example but may be between 100 to 10,000 Angstroms thick. Oxide 17 can be thermally oxidized silicon, phosphosilicate glass (P.S.G.), plasma enhanced silicon dioxide, silicon dioxide formed by decomposition of tetraethyl orthosilicate (T.E.O.S.), or a similar dielectric such as silicon nitride. In some applications it may be desirable to remove most of the blanket layer of oxide 17 to leave a layer of dielectric only on sidewalls of the gate 13.

FIG. 4 illustrates the sectional view of FIG. 3 with the addition of rapid heating or annealing of substrate 11, gate 13, source 14 and drain 15 illustrated by arrows 16. A typical temperature for rapid heating 16 is 1000° C. with a range of 800° to 1250° C. A typical time for rapid heating 16 would be 5 seconds with a range of 1 to 15 seconds.

It is believed that oxide layer 17 acts as a cap in preventing the dopant that was implanted into gate 13, source 14 and drain 15 from being diffused to the sidewalls of gate 13 and oxide layer 12. Without oxide layer 17 the diffused dopant collects on the walls of gate 13 and oxide layer 12. The diffused dopant then becomes the path of least resistance, thus creating current leakage from the gate to source or gate to drain.

The process step after the rapid heating of the device could vary depending on what the device is to be used for. Once the annealing of the device has been completed it is possible to completely remove oxide layer 17. It is also possible to remove all of oxide layer 17 except for what is on the sidewalls of gate 13. An alternative to this, which is not shown in the drawings, would be to form the oxide sidewalls first and then rapid heat the device. If oxide layer 17 is to be used as a dielectric then openings in the oxide will have to be etched over the gate, source and drain regions. This is to provide openings for metal contacts.

Thus it is apparent that there has been provided an improved method of manufacturing a semiconductor device in which the gate to source or gate to drain current leakage has been substantially reduced by the addition of a blanket layer of oxide prior to the rapid heating of the device.

We claim:

1. A method for fabricating a submicron FET device in which gate current leakage is reduced, wherein the method comprises:
   forming a polysilicon gate region;
   implanting dopants into the gate, and into source and drain regions adjacent to the gate;
   depositing a layer of oxide over the gate, source, and drain regions; and
   rapid heating of the gate, source and drain regions.

2. The method as defined in claim 1, in which the rapid heating is in the range of 800° to 1250° C. with a time period of 1 to 15 seconds.

3. The method as defined in claim 1, in which the oxide layer is silicon dioxide.

4. The method as defined in claim 1, in which the oxide layer is phosphosilicate glass.

5. The method as defined in claim 1, in which the oxide layer is formed by decomposition of tetraethyl orthosilicate.

6. A method for fabricating a semiconductor device having a source, a drain, and a gate region in which gate current leakage is reduced, wherein the method comprises:
   implanting the gate, the source, and the drain regions with a dopant;
   providing an insulating cap over the gate; and
   heating of the semiconductor device to activate the dopants in the gate, source, and drain regions.

7. The method as defined in claim 6, in which the heating comprises rapid heating to a temperature in the range of 800° to 1250° C.

8. The method as defined in claim 7, in which the temperature is maintained for a time period of 1 to 15 seconds.

9. A method for fabricating a semiconductor device in which gate current leakage is reduced, wherein the method comprises:
   forming a polysilicon gate region;
   implanting dopants into the gate, and into source and drain regions adjacent to the gate;
   depositing a layer of dielectric over the gate; and
   rapid heating of the semiconductor device.

10. The method as defined in claim 9 in which the dielectric is silicon nitride.

11. A method for fabricating a semiconductor device in which gate current leakage is reduced, wherein the method comprises: forming a polysilicon gate region; implanting dopants into the gate, and into source and drain regions adjacent to the gate; providing a layer of dielectric on sidewalls of the gate; and rapid heating of the semiconductor device to anneal the doped areas.

* * * * *